United States Patent
Ogihara et al.

(10) Patent No.: US 8,748,918 B2
(45) Date of Patent: Jun. 10, 2014

(54) SEMICONDUCTOR DEVICE AND OPTICAL PRINT HEAD

(75) Inventors: Mitsuhiko Ogihara, Tokyo (JP);
Tomohiko Sagimori, Tokyo (JP);
Masaaki Sakuta, Tokyo (JP)

(73) Assignee: Oki Data Corporation, Tokyo (JP)

( * ) Notice: Subject to any disclaimer, the term of this patent is extended or adjusted under 35 U.S.C. 154(b) by 600 days.

(21) Appl. No.: 12/461,091

(22) Filed: Jul. 31, 2009

(65) Prior Publication Data

US 2010/0051979 A1 Mar. 4, 2010

(30) Foreign Application Priority Data

Aug. 27, 2008 (JP) ................................. 2008-217781

(51) Int. Cl.
*H01L 33/00* (2010.01)
*H01L 21/02* (2006.01)
*H01L 33/32* (2010.01)

(52) U.S. Cl.
CPC ........... *H01L 21/02115* (2013.01); *H01L 33/32* (2013.01); *H01L 33/007* (2013.01)
USPC .............. 257/94; 257/100; 257/414; 428/220

(58) Field of Classification Search
CPC .. H01L 33/32; H01L 33/007; H01L 21/02115
USPC .............................. 257/100, 414, 94; 428/220
See application file for complete search history.

(56) References Cited

U.S. PATENT DOCUMENTS

| 5,053,837 | A | * | 10/1991 | Tonai | 257/458 |
| 5,777,372 | A | * | 7/1998 | Kobashi | 257/414 |
| 6,347,106 | B1 | * | 2/2002 | Dijaili et al. | 372/46.01 |
| 7,173,644 | B2 | * | 2/2007 | Takakura | 347/241 |
| 2004/0256624 | A1 | * | 12/2004 | Sung | 257/77 |

FOREIGN PATENT DOCUMENTS

| JP | 2002-329896 A | | 11/2002 |
| JP | 2004-179257 | | 6/2004 |
| JP | 2005276962 A | * | 10/2005 |
| JP | 2008-10571 | | 1/2008 |
| JP | 2008-159767 | | 7/2008 |
| JP | 2008-263126 A | | 10/2008 |

* cited by examiner

*Primary Examiner* — Dale E Page
(74) *Attorney, Agent, or Firm* — Rabin & Berdo, P.C.

(57) ABSTRACT

A semiconductor device includes a diamond-like carbon film formed on the substrate. A thin film is formed on the diamond-like carbon film. The thin film has a thickness thinner than the diamond-like carbon. A semiconductor thin film having a semiconductor element is bonded onto the thin film.

18 Claims, 9 Drawing Sheets

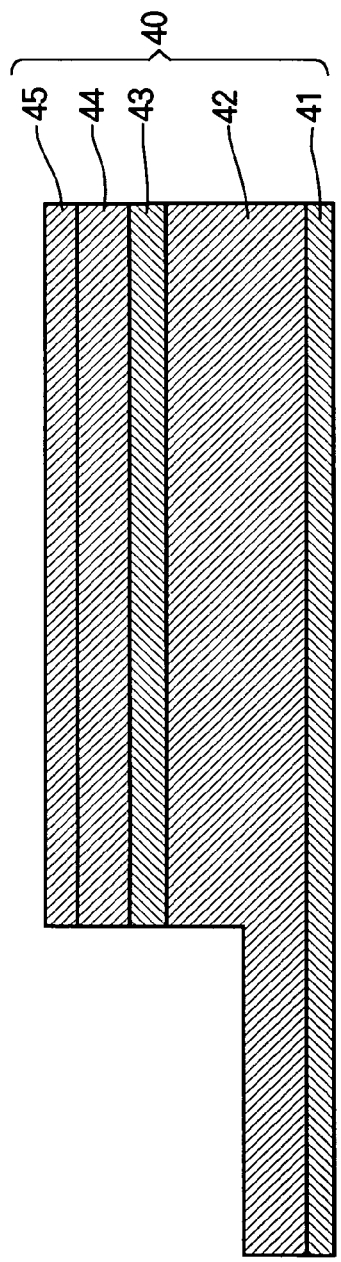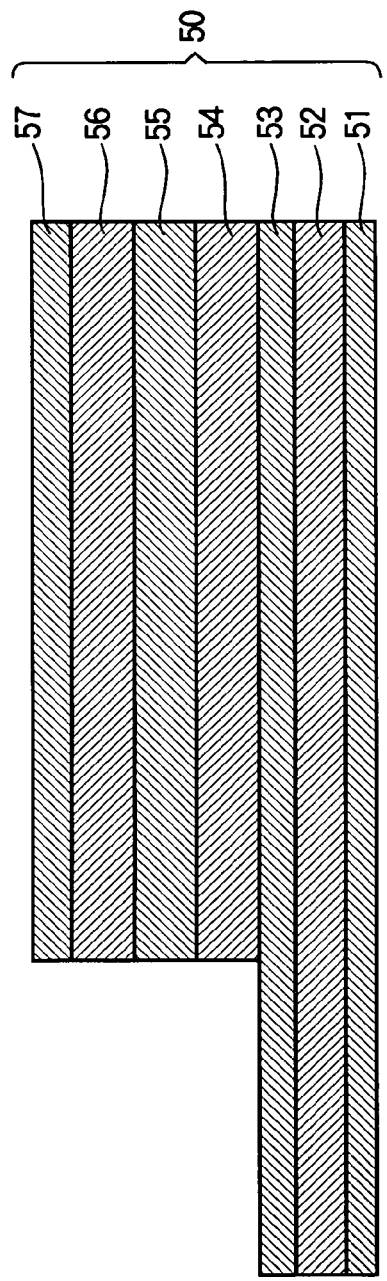

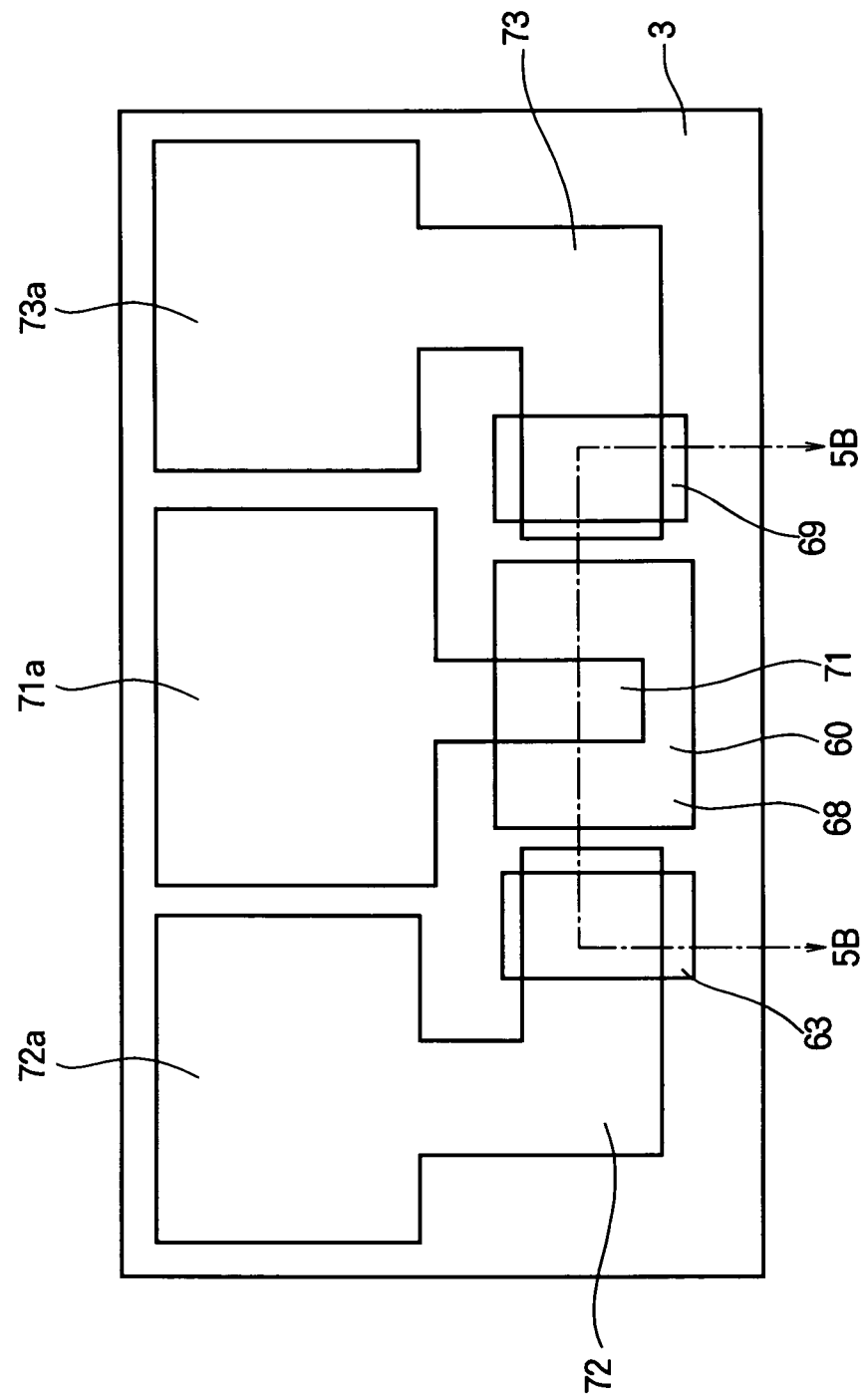

SEMICONDUCTOR DEVICE AND OPTICAL PRINT HEAD

BACKGROUND OF THE INVENTION

The present invention relates to a semiconductor device having a semiconductor element such as a light emitting diode (LED) formed of a semiconductor thin film, and also relates to an optical print head using such a semiconductor device.

A semiconductor element (i.e., an LED or the like) generates heat during operation. A temperature rise of the semiconductor element influences characteristics and reliability of the semiconductor element, and therefore it is necessary to dissipate the heat generated by the semiconductor element to the outside. For example, Patent Document No. 1 discloses a surface-emission type LED device capable of dissipating the heat generated by the LED.

In the surface-emission type LED device, the LED is formed on a sapphire substrate, and the sapphire substrate is bonded onto a diamond substrate via a bonding layer. The diamond substrate has high heat conductivity and high insulation property. The heat generated by the LED is conducted to the diamond substrate and is dissipated to the outside. Patent Document No. 1 discloses another surface-emission type LED device in which the LED is formed on the sapphire substrate, and electrodes of the LED (i.e., on an opposite side to the sapphire substrate) are bonded onto the diamond substrate via the bonding layer.

Patent Document No. 1: Japanese Laid-Open Patent Publication No. 2002-329896

However, there is a demand for further enhancing the heat dissipation property of the semiconductor device.

SUMMARY OF THE INVENTION

The present invention is intended to provide a semiconductor device having enhanced heat dissipation property, and to provide an optical print head using such a semiconductor device.

The present invention provides a semiconductor device including a substrate. A diamond-like carbon film is formed on the substrate. A thin film is formed on the diamond-like carbon film, and the thin film has a thickness thinner than the diamond-like carbon. Further, a semiconductor thin film having a semiconductor element is bonded onto the thin film.

Since the semiconductor thin film is bonded onto the diamond-like carbon film via the thin film, an attractive force is produced between facing surfaces of the semiconductor thin film and the thin film due to intermolecular force (more specifically, van der Waals force or hydrogen bonding force), so that strong bonding strength can be obtained. Further, since the thin film is thinner than the diamond-like carbon film, heat conduction from the semiconductor thin film to the diamond-like carbon film is promoted. Therefore, when a substrate is composed of material with high heat conductivity, the heat can be efficiently dissipated to the outside via the substrate.

The present invention also provides an optical print head including the semiconductor device and an optical system that guides a light emitted by the light emitting element of the semiconductor device.

Since the optical print head uses the semiconductor device, a compact and reliable optical print head exhibiting high light emission efficiency can be obtained.

Further scope of applicability of the present invention will become apparent from the detailed description given hereinafter. However, it should be understood that the detailed description and specific embodiments, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

In the attached drawings:

FIG. 3 is a sectional view schematically showing a semiconductor device according to Modification 1 of Embodiment 1 of the present invention;

FIG. 4 is a sectional view schematically showing a semiconductor device according to Modification 2 of Embodiment 1 of the present invention;

FIG. 5A is a plan view schematically showing a semiconductor device according to Modification 3 of Embodiment 1 of the present invention;

DETAILED DESCRIPTION OF THE PREFERRED EMBODIMENT

Hereinafter, embodiments and examples of the present invention will be described with reference to the attached drawings. In this regard, the present invention is not limited to the embodiments, but can be modified without departing from the scope of the invention.

<Structure of Semiconductor Device>

Figure 1A:
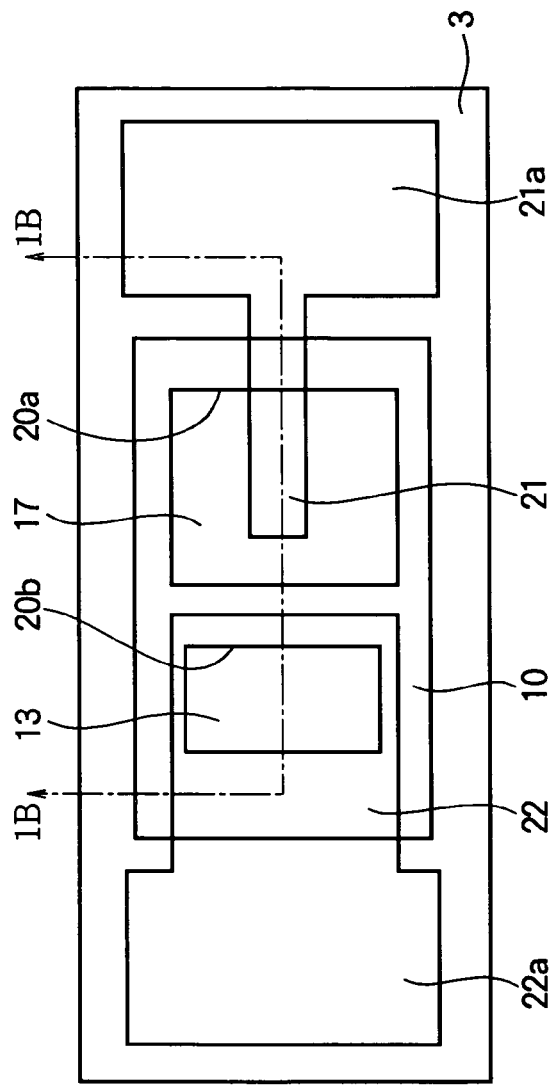
FIGS. 1A and 1B are a plan view and a sectional view schematically showing a semiconductor device according to Embodiment 1 of the present invention.
Figure 1B:
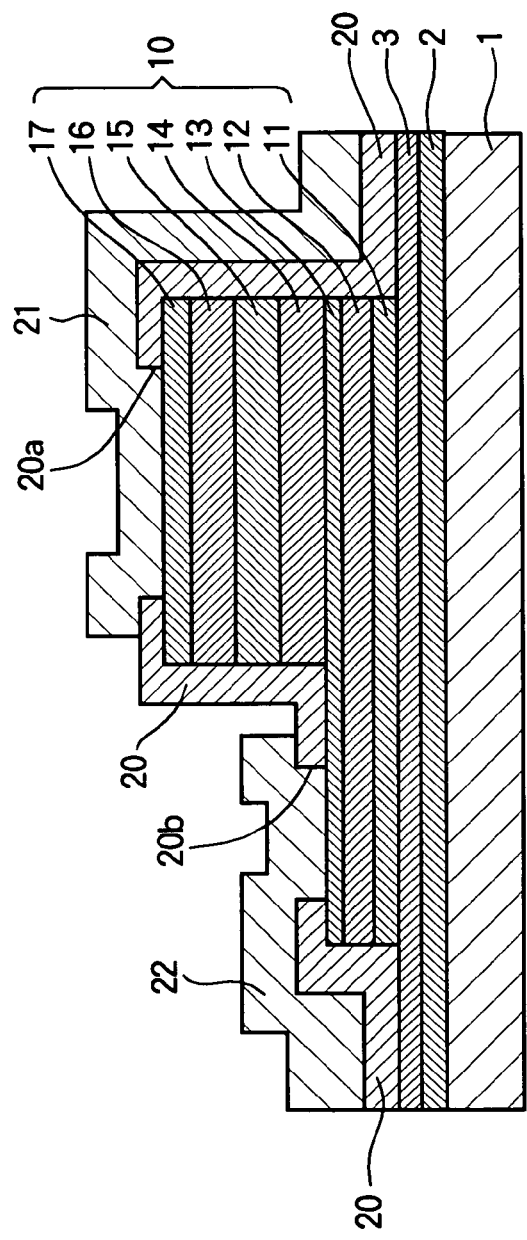

FIG. 1A is a plan view schematically showing a configuration of a semiconductor device according to Embodiment 1 of the present invention. FIG. 1B is a sectional view taken along line 1B-1B in FIG. 1A.

The semiconductor device includes a substrate 1 for mounting elements, and the substrate 1 is composed of material having high heat conductivity. For example, the substrate 1 is composed of a metal substrate, a ceramic substrate, a glass substrate, a plastic substrate, a Si substrate or the like. In the case of the metal substrate, the substrate 1 can be formed of copper (Cu), aluminum (Al), brass, nickel (Ni), zinc (Zn) and stainless steel (i.e., an alloy containing iron (Fe), chrome (Cr), nickel (Ni) or manganese (Mn)). In the case of the ceramics substrate, the substrate 1 can be formed of AlN, $Al_2O_3$, SiN, $SiO_2$ or the like.

A thin diamond-like carbon film 2 (hereinafter referred to as a DLC film 2) is formed on the substrate 1. A thin film 3 (for example, an organic thin film) is formed on the DLC film 2.

The DLC film 2 has high electric insulation property, bonding strength with different kind of film and high heat conductivity. The thickness of the DLC film 2 is, for example, from 5 nm to 100 nm. The organic thin film 3 is preferably composed of material having at least high polarizing property. More specifically, the organic thin film 3 is preferably composed of a polyimide film, a transparent organic thin film or the like. The thickness of the organic thin film 3 preferably thinner than the DLC film 2. A semiconductor thin film 10 is directly bonded onto the organic thin film 3 by means of intermolecular force without using a bonding adhesive.

The semiconductor thin film 10 includes a semiconductor element (for example, a two-terminal type LED as a light emitting element). The semiconductor thin film 10 is formed of a single-crystal semiconductor thin film (for example, a compound semiconductor thin film, a Si thin film or the like) having been formed by crystal growth on a base material, and having been separated from the base material. The semiconductor thin film 10 has a single layer structure or a layered structure of a plurality of layers. In the case where the semiconductor light thin film 10 is composed of compound semiconductor thin films, the semiconductor thin film 10 includes a first conductivity type bonding layer 11 (for example, n-GaAs layer), a first conductivity type conducting layer 12 (for example, n-Al$_r$Ga$_{1-r}$As layer), a first conductivity type contact layer 13 (for example, n-GaAs layer), a first conductivity type cladding layer 14 (for example, n-Al$_x$Ga$_{1-x}$As layer), an active layer 15 (for example, n-Al$_y$Ga$_{1-y}$As layer) of the first or second conductivity type or non-dope type, a second conductivity type cladding layer 16 (for example, p-Al$_z$Ga$_{1-z}$As layer), and a second conductivity type contact layer 17 (for example, p-GaAs layer) which are layered in this order from the bottom. The semiconductor thin film 10 has a thickness preferably thinner than 10 µm, more preferably thinner than 2.5 µm, and is bonded onto the organic thin film 3 by means of intermolecular force.

The semiconductor thin film 10 is covered with an interlayer insulation film 20 composed of a SiN film, an organic insulation film or the like. A second conductivity side contact opening 20a and a first conductivity side contact opening 20b are formed on parts of the interlayer insulation film 20 for exposing electrodes. A second conductivity side electrode 21 (of a metal wiring layer) is formed on a part of the interlayer insulation film 20 and on a part of the second conductivity side contact opening 20a. The second conductivity side electrode 21 is connected to the second conductivity type contact layer 17 of the semiconductor thin film 10. Further, a first conductivity side electrode 22 (of a metal wiring layer) is formed on a part of the interlayer insulation film 20 and on a part of the first conductivity side contact opening 20b. The first conductivity side electrode 22 is connected to the first conductivity type contact layer 13 of the semiconductor thin film 10. The second conductivity side electrode 21 and the first conductivity side electrode 22 are respectively connected to connection pads 21a and 22a which are to be connected with external control circuits or the like.

<Operation of Semiconductor Device>

A description will be made of an operation of the two-terminal type LED constituted by the semiconductor thin film 10 shown in FIG. 1. For example, the connection pad 22a and the first conductivity side electrode 22 are given a ground potential, and the pad 21a and the second conductivity side electrode 21 are given a positive electric potential. In such a case, a driving current flows through the pad 21a, the second conductivity side electrode 21, the LED (i.e., the semiconductor thin film 10), the first conductivity side electrode 22 and the pad 22a so as to activate the LED. A light emitting region of the LED including the active layer 15 emits light, and the light proceeds to the outside via the second conductivity side contact opening 20a.

The surface of the organic thin film 3 has high polarizing property, and therefore an electrostatic interaction (i.e., attractive force) occurs between the organic thin film 3 and the semiconductor thin film 10 due to polarization, so that a strong bonding force is produced between the organic thin film 3 and the semiconductor thin film 10. The semiconductor thin film 10 has a thickness in the order of µm, and therefore heat generated by the LED is soon conducted to the adjacent layer, i.e., the organic thin film 3. Further, the organic thin film 3 is thin, and therefore the heat from the semiconductor thin film 10 is efficiently conducted to the DLC film 2. The substrate 1 composed of material with high heat conductivity is disposed below the DLC film 2, and therefore the heat (conducted to the DLC film 2) is efficiently dissipated to the outside through the substrate 1.

<Manufacturing Method of Semiconductor Device>

FIGS. 2A through 2E are schematic views for illustrating an example of a manufacturing method of the semiconductor device according to Embodiment 1.

Figure 2A:
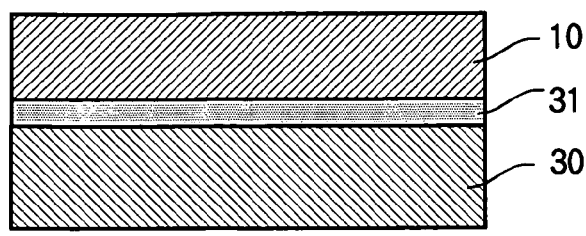
FIGS. 2A through 2E are schematic sectional views for illustrating an example of a manufacturing method of the semiconductor device according to Embodiment 1 of the present invention.

In order to manufacture the semiconductor device shown in FIG. 1, first, a substrate 30 of semiconductor (for example, a GaAs substrate) is prepared as shown in FIG. 2A. Further, a sacrificial layer 31 (for example, a semiconductor layer of Al$_s$Ga$_{1-s}$As (s≥0.6)) is formed on the substrate 30. The sacrificial layer 31 is a composed of a semiconductor material which is selectively etchable with respect to the substrate 30 and with respect to a single-crystal semiconductor thin film 10 which is to be formed on the sacrificial layer 31. After the sacrificial layer 31 is formed, the single-crystal semiconductor thin film 10 (having a layered structure) is formed on the sacrificial layer 31 using a semiconductor crystal growth method such as Metal Organic Chemical Vapor Deposition (MOCVD) or Molecular Beam Epitaxy (MBE) method.

The semiconductor thin film 10 has a thickness required to obtain the LED structure and predetermined properties. For example, the thickness of the semiconductor thin film 10 is in a range from 0.1 to 10 µm. In this regard, if the semiconductor thin film 10 is too thick, it becomes difficult to form wirings over the semiconductor thin film 10 in a subsequent wiring formation process, and therefore the thickness of the semiconductor thin film 10 is set to an optimum thickness.

Figure 2B:
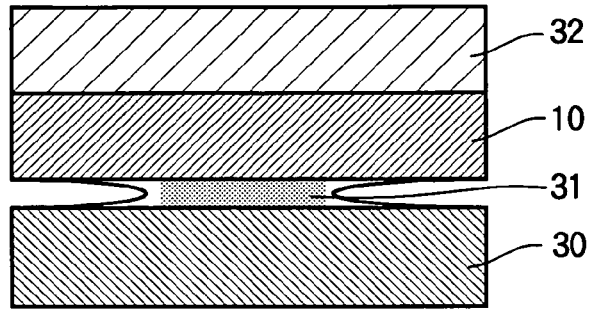

In a process shown in FIG. 2B, the semiconductor thin film 10 is selectively etched using a photolithographic technology so as to form a rectangular semiconductor thin film pattern as shown in FIG. 1A and to expose the sacrificial layer 31. Next, a supporting body 32 is formed on the semiconductor thin film 10, and then the sacrificial layer 31 is etched using etching solution. FIG. 2B illustrates a state while the sacrificial layer 31 is being etched.

Figure 2C:
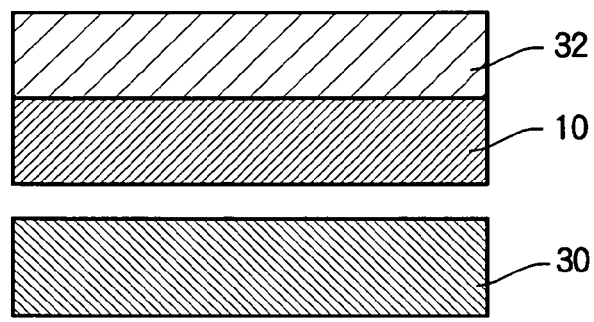

In a process shown in FIG. 2C, the sacrificial layer 31 is completely removed by etching, so that the semiconductor thin film 10 is separated from the substrate 30.

Figure 2D:
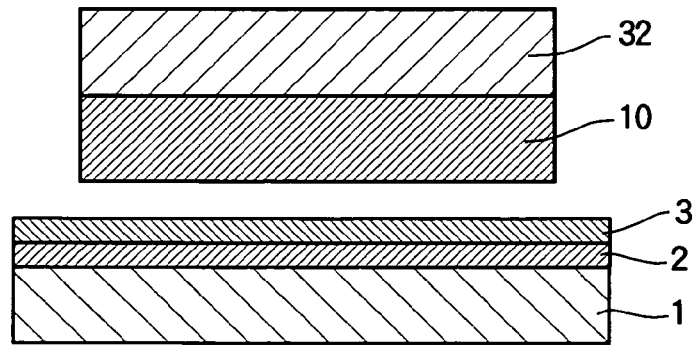

In a process shown in FIG. 2D, the substrate 1 such as a metal substrate or the like is prepared. The DLC film 2 is formed on an entire surface of the substrate 1 using sputtering method, chemical vapor deposition (CVD) method or the like. The DLC film 2 is an insulation film having high heat conductivity. Then, the organic thin film 3 is formed on the DLC film 2. Next, the semiconductor thin film 10 supported by the supporting body 32 is positioned above and with respect to the organic thin film 3.

Figure 2E:
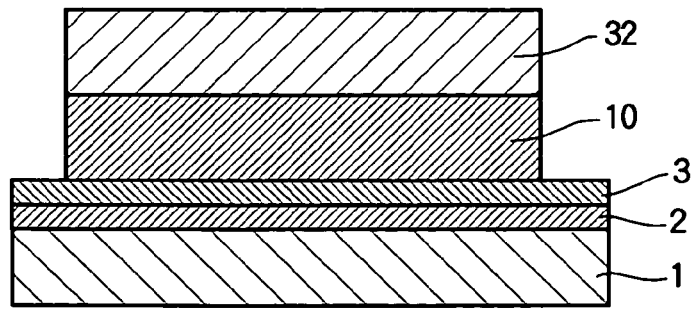

In a process shown in FIG. 2E, a back (bottom) surface of the semiconductor thin film 10 (supported by the supporting body 32) is pressed against the surface of the organic thin film 3 so that the back surface of the semiconductor thin film 10 tightly adheres to the surface of the organic thin film 3. With such a process, the semiconductor thin film 10 is bonded onto the organic thin film 3 by means of intermolecular force between bonding surfaces. After the semiconductor thin film 10 is bonded onto the organic thin film 3, the supporting body 32 is removed using parting agent (remover) or the like.

After the semiconductor thin film 10 is bonded onto the organic thin film 3, the semiconductor thin film 10 is formed into the LED structure as shown in FIGS. 1A and 1B using etching or the like. Further, the interlayer insulation film 20 (composed of a SiN film, an organic insulation film or the like) is formed to cover the semiconductor thin film 10 using CVD or the like. Further, the second conductivity side contact opening 20a and the first conductivity side contact opening 20b are formed on parts of the interlayer insulation film 20 covering the semiconductor thin film 10 using photolithographic technology. Then, the pad 21a, the second conductivity side electrode 21, the pad 22a and the first conductivity side electrode 22 (of the metal wiring layer) are selectively formed on the interlayer insulation film 20. The second conductivity side electrode 21 is connected to the second conductivity type contact layer 17 via the second conductivity side contact opening 20a. The first conductivity side electrode 22 is connected to the first conductivity type contact layer 13 via the first conductivity side contact opening 20b. With this, the manufacturing process of the semiconductor device including the semiconductor element (i.e., the two-terminal type LED) constituted by the semiconductor thin film 10 is completed.

<Comparison>

Before describing the effect of Embodiment 1, a description will be made of a general LED device (i.e., a general semiconductor device) disclosed in Patent Publication No. 1.

In the general LED device, heat is mainly generated at a light emitting region in the vicinity of a PN-junction or an active layer. In order to efficiently dissipate the heat, it is necessary that the light emitting region is close to a substrate with high heat conductivity. However, in the LED device disclosed in the Patent Document No. 1, a sapphire substrate is disposed between the LED and a diamond substrate with high heat conductivity, and therefore high heat dissipation efficiency is not obtained.

Further, for promoting heat dissipation, it is preferable not to provide a material having low heat conductivity between the LED and the substrate with high heat conductivity. However, in the LED device disclosed in Patent Publication No. 1, a bonding layer is formed between the sapphire substrate (on which the LED is formed) and the diamond substrate, and therefore high heat dissipation efficiency is not obtained.

Furthermore, when metal materials are bonded to each other, voids may be formed between bonding surfaces due to a reaction of the metal materials. If such voids are formed, a contact area between the metal materials decreases, and heat dissipation efficiency decreases. In order to solve this problem, it is conceivable to provide an insulation film (preferably having high heat conductivity) between the LED and the metal layer. However, it is difficult for the insulation film to provide both of high heat conductivity and sufficient bonding property with which the LED is bonded to the insulation film.

<Effect>

In contrast, according to Embodiment 1 of the present invention, the organic thin film 3 with high polarizing property is formed on the DLC film 2 on the substrate 1, and the semiconductor thin film 10 is bonded onto the organic thin film 3. Therefore, strong interaction is produced between the surfaces the organic thin film 3 and the semiconductor thin film 10, and a strong bonding strength is obtained. Further, the thickness of the organic thin film 3 is thinner than the thickness of the DLC film 2 disposed below the organic thin film 3, and therefore heat is efficiently conducted from the semiconductor thin film 10 to the DLC film 2. Further, since the substrate 1 (on which the DLC film 2 is formed) is composed of material having high heat conductivity, the heat is efficiently dissipate to the outside through the substrate 1.

The structure and manufacturing method of the semiconductor device according to Embodiment 1 can be modified in various ways. Hereinafter, descriptions will be made of Modifications 1 to 5 regarding the structure of the semiconductor device and Modification 6 regarding the manufacturing method.

Modification 1.

FIG. 3 is a sectional view schematically showing a semiconductor thin film 40 according Modification 1 of Embodiment 1.

The semiconductor thin film 40 constitutes a semiconductor element (for example, two-terminal type LED as a light emitting element), as with the semiconductor thin film 10 of Embodiment 1 (FIG. 1B). The semiconductor thin film 40 is composed of a single-crystal semiconductor thin film (for example, a compound semiconductor thin film) having been grown on a base material and having been separated from the base material.

The semiconductor thin film 40 has a layered structure including a plurality of layers. For example, the semiconductor thin film 40 includes an AlN layer 41, an n$^+$GaN layer 42, an active layer 43 formed of a GaN/InGaN layered structure (i.e., a multiple-quantum-well structure), a p-AlGaN layer 44 and a p-GaN layer 45 layered in this order from the bottom. The active layer 43 can be formed of an InGaN layer or single-quantum-well layer, instead of the multiple-quantum-well layer. The semiconductor thin film 40 configured as above has substantially the same function and effect as the semiconductor thin film 10.

Modification 2.

FIG. 4 is a sectional view showing a semiconductor thin film 50 according Modification 2 of Embodiment 1.

The semiconductor thin film 50 constitutes a semiconductor element (for example, two-terminal type LED as a light emitting element), as with the semiconductor thin film 10 of Embodiment 1 (FIG. 1B). The semiconductor thin film 50 is composed of a single-crystal semiconductor thin film (for example, a compound semiconductor thin film) having been grown on a base material and having been separated from the base material.

The semiconductor thin film 50 has a layered structure including a plurality of layers of AlGaInP-based materials. For example, the semiconductor thin film 50 includes a bonding layer 51 (for example, a first conductivity type GaAs layer), a conducting layer 52 (for example, a first conductivity type $(Al_{x1}Ga_{1-x1})_{y1}In_{1-y1}P$), a first conductivity type contact layer 53 (for example, a first conductivity type GaAs layer), a cladding layer 54 (for example, a first conductivity type $(Al_{x2}Ga_{1-x2})_{y2}In_{1-y2}P$), an active layer 55 (for example, a first conductivity type, a second conductivity type or non-dope $(Al_{x3}Ga_{1-x3})_{y3}In_{1-y3}P$), a cladding layer 56 (for example, a second conductivity type $(Al_{x4}Ga_{1-x4})_{y4}In_{1-y4}P$) and a second conductivity type contact layer 57 (for example, a second conductivity type GaAs layer) which are layered in this order from the bottom.

Here, for example, y1, y2, y3, y4 and y5 can be set so as to satisfy y1=y2=y3=y4=y5=0.5. Further, x1, x2, x3 and x4 can be set so as to satisfy x1, x2, x4>x3. More specifically, x1, x2, x3 and x4 can be set so as to satisfy x1, x2, x4=0.6, x3=0. The active layer 55 can have a single-quantum-well structure or a multiple-quantum-well structure. Further, the active layer 55 can be formed of a strained crystal ($Ga_{1-x}In_{1-x}P$, x>0.5) having lattice coefficient mismatched with that of GaAs. The semiconductor thin film 50 configured as above has substantially the same function and effect as the semiconductor thin film 10.

Modification 3.

Figure 5B:
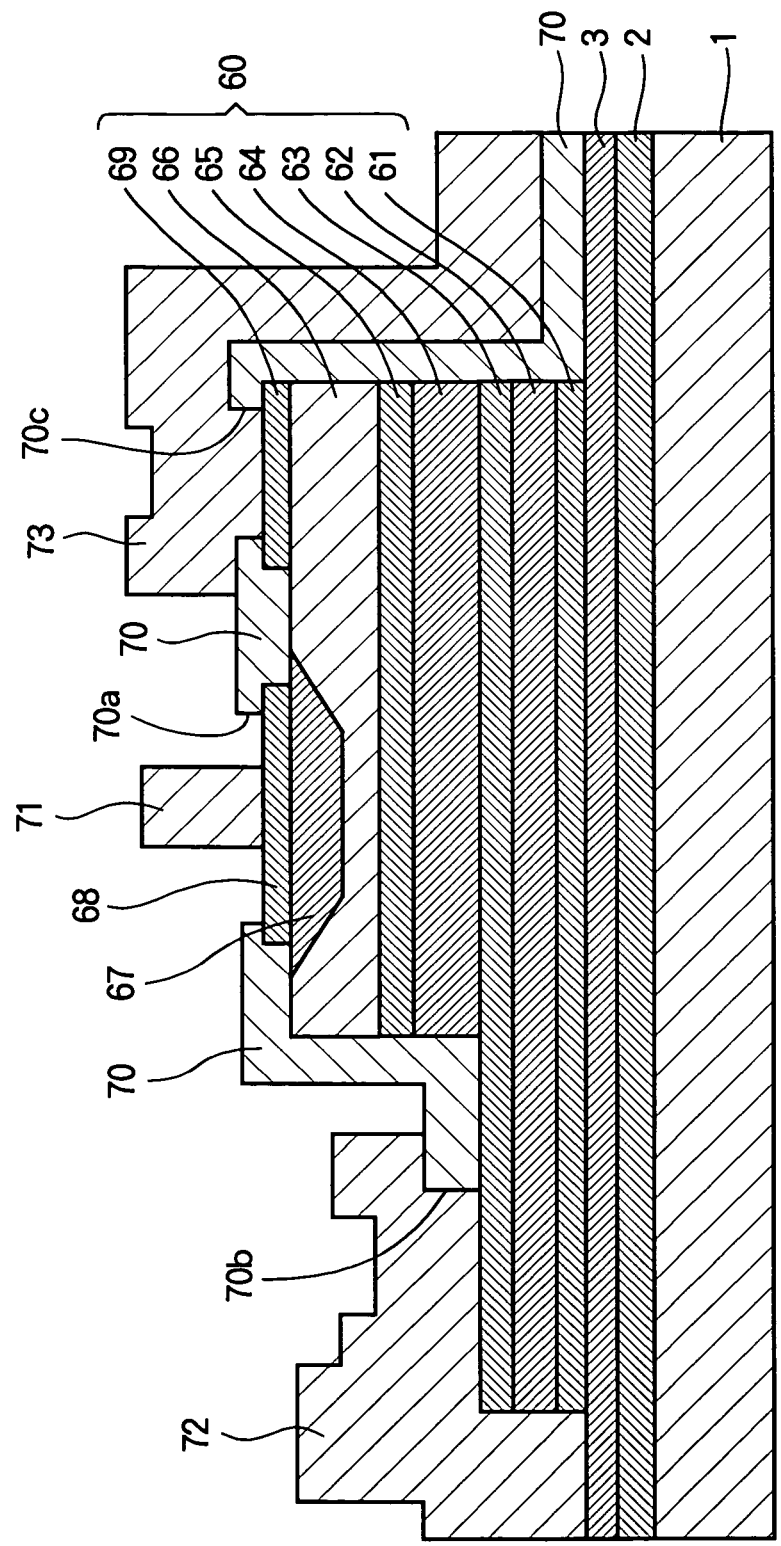
FIG. 5B is a sectional view schematically showing the semiconductor device according to Modification 3 of Embodiment 1 of the present invention.

FIG. 5A is a plan view schematically showing a semiconductor device according Modification 3 of Embodiment 1. FIG. 5B is a sectional view taken along line 5B-5B in FIG. 5A.

The semiconductor device of Modification 3 includes the substrate 1, the DLC film 2 formed on the substrate 1, the organic thin film 3 formed on the DLC film 2, and the semiconductor thin film 60 formed on the organic thin film 3, as with the semiconductor thin film 10 of Embodiment 1 (FIG. 1B). However, the semiconductor thin film 60 has a structure different from the semiconductor thin film 10 of Embodiment 1.

The semiconductor thin film 60 constitutes a semiconductor element of, for example, three-terminal type LED as a light emitting element, which is also referred to as a light emitting thyristor. The semiconductor thin film 60 includes a bonding layer 61 (for example, n-GaAs layer), a conducting layer 62 (for example, n-$Al_tGa_{1-t}As$), a first conductivity type first contact layer 63 (for example, n-GaAs layer), a first conductivity type cladding layer 64 (for example, n-$Al_xGa_{1-x}As$ layer), a second conductivity type active layer 65 (for example, p-$Al_yGa_{1-y}As$ layer), a first conductivity type cladding layer 66 (for example, n-$Al_zGa_{1-z}As$ layer), a second conductivity type region 67 formed selectively in the first conductivity type cladding layer 66 (for example, a diffusion region formed by selectively diffusing Zn), a second conductivity type contact layer 68 (for example, p-GaAs layer) formed on the second conductivity type region 67, and a first conductivity type second contact layer 69 (for example, n-GaAs layer) formed on the first conductivity type cladding layer 66 layered in this order from the bottom.

The semiconductor thin film 60 is covered with an interlayer insulation film 70 formed of a SiN film, an organic insulation film or the like. A second conductivity side contact opening 70a and first conductivity side contact openings 70b and 70c are formed on parts of the interlayer insulation film 70 for exposing electrodes. A second conductivity side electrode 71 (of a metal wiring layer) is formed on a part of the interlayer insulation film 70 and on a part of the second conductivity side contact opening 70a. The second conductivity side electrode 71 is connected to the second conductivity type contact layer 68 of the semiconductor thin film 60. A first conductivity side first electrode 72 (of a metal wiring layer) is formed on a part of the interlayer insulation film 70 and on a part of the first conductivity side contact opening 70b. The first conductivity side first electrode 72 is connected to the first conductivity type first contact layer 63 of the semiconductor thin film 60. Further, a first conductivity side electrode 73 (of a metal wiring layer) is formed on a part of the interlayer insulation film 70 and on a part of the first conductivity side contact opening 70c. The first conductivity side electrode 73 is connected to the first conductivity type second contact layer 69 of the semiconductor thin film 60.

The second conductivity side electrode 71 and the first conductivity side electrodes 72 and 73 are respectively connected to connection pads 71a, 72a and 73a which are to be connected with external control circuits or the like.

When the three-terminal type LED constituted by the semiconductor thin film 60 is to be operated, for example, the pad 72a and the first conductivity side electrode 72 are given a ground potential, and the pad 71a and the second conductivity side electrode 71 are given a positive electric potential. In this state, when the pad 73a and the first conductivity side electrode 73 are given a gate voltage, the three-terminal LED is turned on, and a driving current flows through the pad 71a, the second conductivity side electrode 71, the LED (i.e., the semiconductor thin film 60), the first conductivity side electrode 72 and the pad 72a so as to activate the LED. A light emitting region of the LED including the second conductivity type active layer 65 emits light, and the light proceeds to the outside via the second conductivity side contact opening 70a.

As in Embodiment 1, the heat generated by the LED is conducted to the organic thin film 3 bonded to the semiconductor thin film 60. Since the organic thin film 3 is thin, the heat is efficiently conducted to the DLC film 2. Since the substrate 1 (on which the DLC film 2 is formed) is composed of material having high heat conductivity, the heat is efficiently dissipated to the outside through the substrate 1. Therefore, the same advantage as that of Embodiment 1 can be obtained.

Modification 4.

Figure 6:
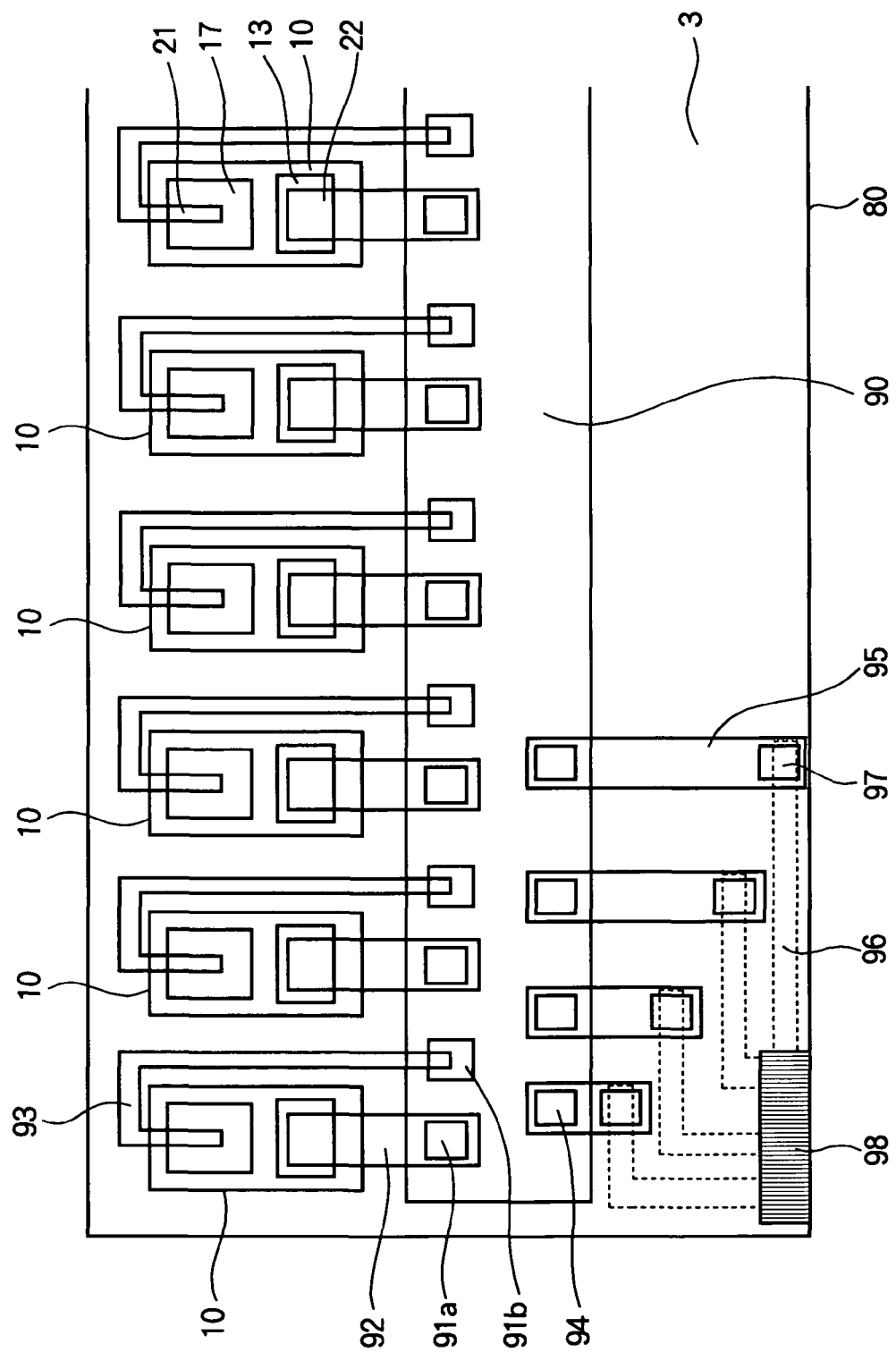
FIG. 6 is a plan view schematically showing a semiconductor device according to Modification 4 of Embodiment 1 of the present invention.

FIG. 6 is a plan view schematically showing a semiconductor device according Modification 4 of Embodiment 1.

In the semiconductor device of Modification 4, the substrate 1 of Embodiment 1 (FIGS. 1A and 1B) is replaced with a larger substrate 80. The DLC film 2 is formed on the substrate 80, and the organic thin film 3 is formed on the DLC film 2 as in Embodiment 1. A plurality of (for example, sixth) semiconductor elements (for example, two-terminal type LED) constituted by the semiconductor thin films 10 shown in FIGS. 1A and 1B are arranged in a row, and are bonded onto the organic thin film 3. Further, a Si thin film 90 is disposed in the vicinity of the semiconductor elements, and is bonded onto the organic thin film 3.

The Si film 90 has circuit elements (for example, driving circuits for driving the semiconductor elements), connecting regions 91a, 91b and 94 or the like. The connecting regions 91a and 91b of the Si film 90 (with the driving circuits) are connected to the semiconductor elements using metal wirings 92 and 93 in the form of thin film. Further, metal wirings 95 and 96 (in the form of thin film), connecting regions 97, an input terminal 98 for supplying signals, electric power or the like from outside, or the like are provided on the surface of or inside the substrate 80. The metal wirings 96 connected to the input terminal 98 are connected to the metal wirings 95 at the connecting regions 97. The metal wirings 95 connect the metal wirings 96 and the driving circuits via the connecting regions 94.

The size of the light emitting region of each semiconductor thin film 10 can be suitably designed in accordance with the arrangement pitch of the semiconductor elements (i.e., the semiconductor thin films 10). For example, the size of the light emitting region of each semiconductor thin film 10 is 16 µm×16 µm, and the arrangement pitch is 42.3 µm. As another example, the size of the light emitting region of each semiconductor thin film 10 is 21.2 µm×21.2 µm, and the arrangement pitch is 21.2 µm. Other components are the same as those of Embodiment 1 (FIGS. 1A and 1B).

With the semiconductor device configured as shown in FIG. 6, a plurality of the semiconductor elements can be separately controlled to emit lights by means of the driving circuits of the Si thin film 90.

In this Modification 4, a plurality of the semiconductor elements formed by the semiconductor thin films 10 and the Si thin film 90 with the driving circuits for driving the semiconductor elements are bonded onto the organic thin film 3. Therefore, although the semiconductor elements and driving circuits are integrated, the heat generated by the respective semiconductor elements can be efficiently dissipated. Accordingly, degradation of property of the semiconductor elements and the driving circuits can be prevented, and lifetimes thereof can be lengthened. Thus, reliability and property of the integrated semiconductor elements and the driving circuits can be ensured.

In this regard, although six semiconductor elements (i.e., the semiconductor thin films 10) are arranged in the above described example, the number of the semiconductor elements is not limited. Further, although the semiconductor elements are arranged in a row in the above described example, the semiconductor elements can also be arranged two-dimensionally. Further, the semiconductor elements arranged on the substrate 80 can be the same as each other, or can be different (or partially different) from each other. The semiconductor elements arranged on the substrate 80 can be formed of different constituent materials.

Modification 5.

Figure 7:
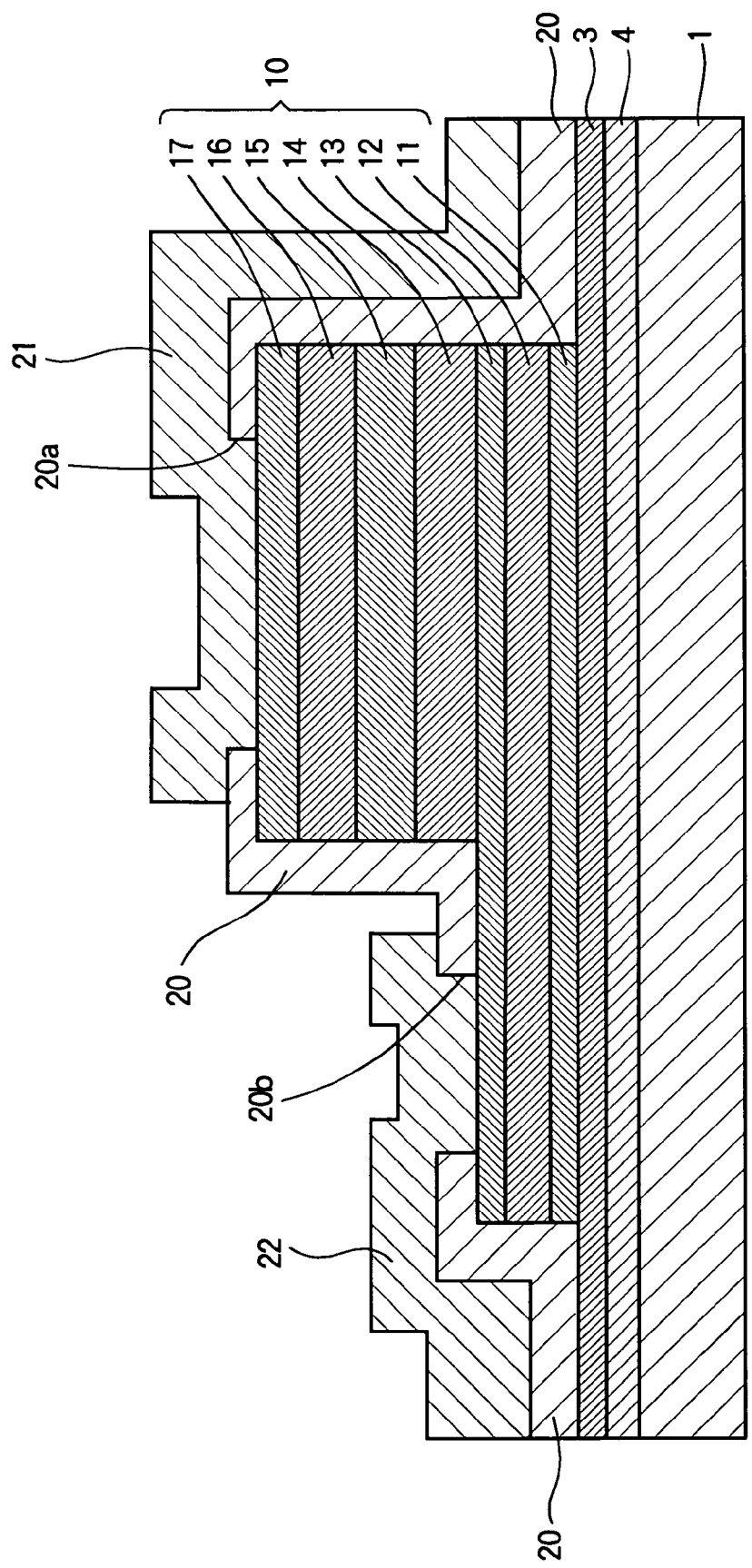
FIG. 7 is a sectional view schematically showing a semiconductor device according to Modification 5 of Embodiment 1 of the present invention.

FIG. 7 is a sectional view schematically showing a semiconductor device according to Modification 5 of Embodiment 1.

In the semiconductor device of Modification 5, the DLC film 2 is replaced with a metal layer 4. The metal layer 4 is composed of one or a plurality of layers composed of material(s) selected from Au, AuGeNi, Pt, Ti, Ni, Al, AlNd, Cu and the like.

According to the semiconductor device of Modification 5, strong bonding strength between the organic thin film 3 and the semiconductor thin film 10 is obtained, and heat is efficiently dissipate to the outside through the metal layer 4 and the substrate 1.

Alternatively, it is possible to employ a layered structure in which the metal layer 4 is formed on the DLC film 2 or a layered structure in which the DLC film 2 is formed on the metal layer 4.

Modification 6.

In the manufacturing method described in Embodiment 1, the semiconductor thin film 10 is separated from the substrate 30 by removing the sacrificial layer 31 using etching as shown in FIGS. 2A through 2C.

However, the semiconductor thin film 10 can also be separated from the substrate 30 by removing a part of the substrate 30 in the vicinity of a border between the substrate 30 and the semiconductor thin film 10 using etching. Alternatively, it is possible to form the semiconductor substrate 10 via an etching stopper layer (not shown) on the substrate 30, and to remove the substrate 30 using etching. Alternatively, it is also possible to remove the substrate 30 using grinding or the like.

Embodiment 2.

<Structure of Semiconductor Device>

Figure 8:
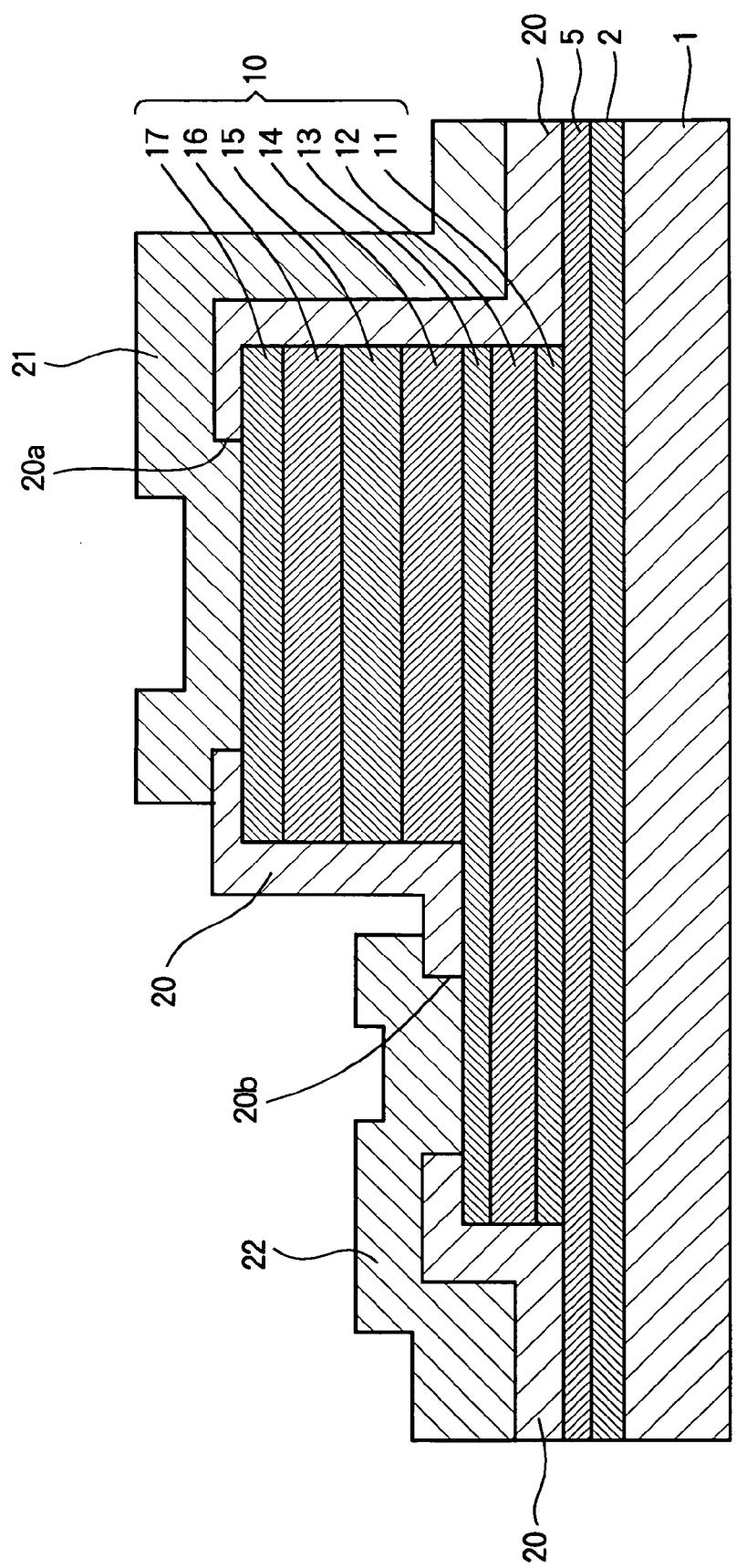
FIG. 8 is a sectional view schematically showing a semiconductor device according to Embodiment 2 of the present invention.

FIG. 8 is a sectional view schematically showing a semiconductor device according to Embodiment 2 of the present invention. In FIG. 8, components that are the same as those of Embodiment 1 (FIGS. 1A and 1B) are assigned the same reference numerals.

The semiconductor device of Embodiment 2 is different from that of Embodiment 1 in that an inorganic thin film 5 is disposed between the DLC film 2 and the semiconductor thin film 10 (having been described in Embodiment 1). The inorganic thin film 5 is composed of, for example, AlN, $Al_2O_3$, SiN, $SiO_2$ or the like. The thickness of the inorganic thin film 5 is preferably thinner than the DLC film 2. Other components, specific examples and the like are the same as those of Embodiment 1.

<Function and Effect>

The two-terminal type LED constituted by the semiconductor thin film 10 of Embodiment 2 performs the same light emitting operation as described in Embodiment 1.

In the case where the inorganic thin film 5 (on the DLC film 2) is composed of, for example, AlN or $Al_2O_3$ or the like, and the semiconductor thin film 10 is composed of, for example, compound semiconductor, a heat expansion coefficient of the inorganic thin film 5 is close to that of the semiconductor thin film 10. In the case where the inorganic thin film 5 is composed of, for example, SiN, $SiO_2$ or the like, and the semiconductor thin film 10 is composed of, for example, Si, a strong bonding force is produced between the inorganic thin film 5 and the surface element of the semiconductor thin film 10. In either case, a strong bonding force can be produced due to strong interaction between the bonding surfaces of the inorganic thin film 5 and the semiconductor thin film 10.

Particularly, the inorganic thin film 5 such as AlN, $Al_2O_3$, SiN, $SiO_2$ or the like has high heat conducting property. Therefore, due to the thinness of the inorganic thin film 5, the heat conducting property is further enhanced, with the result that the semiconductor device having excellent heat dissipation property can be obtained.

The above described various modifications of Embodiment 1 regarding the semiconductor thin film, the semiconductor element, the insulation film, the electrodes and the wirings are applicable to Embodiment 2.

Embodiment 3.

<Structure of Print Head>

Figure 9A:
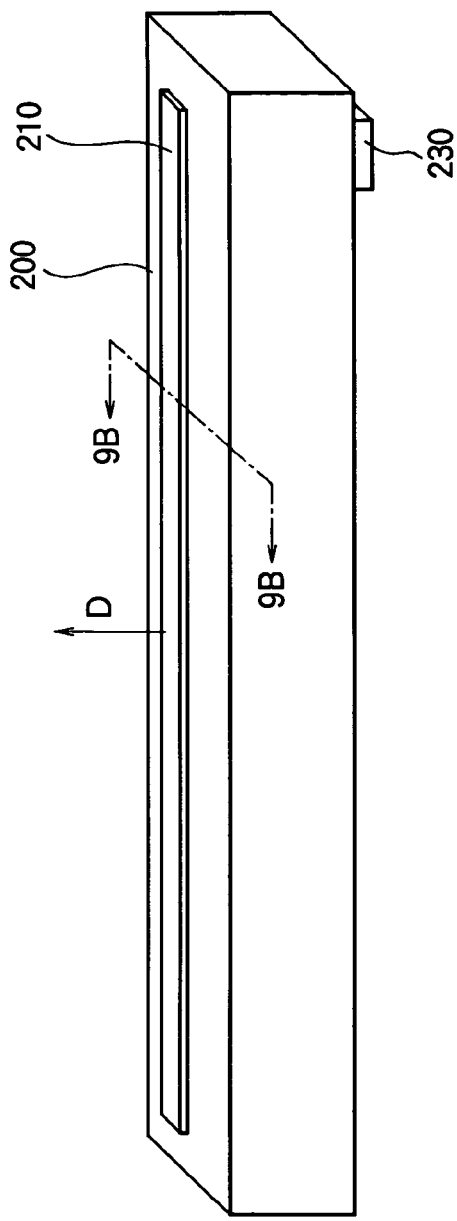
FIGS. 9A and 9B are a perspective view and a sectional view schematically showing an optical print head according to Embodiment 3 of the present invention.
Figure 9B:
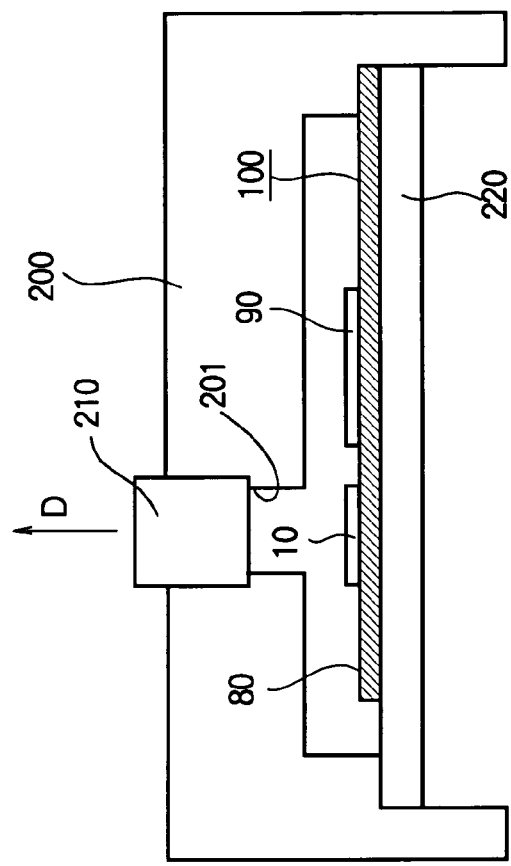

FIG. 9A is a perspective view schematically showing a configuration example of an optical print head according to Embodiment 3 of the present invention. FIG. 9B is a sectional view taken along line 9B-9B in FIG. 9A.

The optical print head is constituted by using the semiconductor device shown in FIG. 6 (referred to as the semiconductor device 100). The optical print head includes a holder 200 in the form of a rectangular tube whose bottom is opened. A groove 201 is formed on a top surface of the holder 200. The groove 201 extends in the longitudinal direction of the holder 200. An optical system (for example, a rod lens array) 210 is mounted in the groove 201. The rod lens array 210 is formed by arranging rod-like lenses along the longitudinal direction of the groove 201. A base member 220 is mounted to the holder 200. At least one semiconductor device 100 having configured as shown in FIG. 6 is mounted onto the base member 220.

The semiconductor device 100 includes a substrate 80 fixed onto the base member 220. A plurality of the semiconductor thin films 10 with light emitting elements (LEDs) and the Si thin film 90 with the driving circuits are bonded onto the substrate 80. The semiconductor thin film 10 is disposed facing the rod lens array 210. The base member 220 on which the semiconductor device 100 is mounted is pressed upward from the bottom by a clamper (not shown). With such a structure, the base member 220 is held by the holder 200, and the position of the semiconductor thin film 10 is determined relative to the rod lens array 210.

A connector 230 is mounted to the bottom side of the holder 200. A not shown cable is connected to the connector 230 for supplying electric power and control signals to the semiconductor device 100 from outside.

The semiconductor device 100 is not limited to that shown in FIG. 6, but any of the semiconductor devices according to Embodiment 1 and 2 and modifications thereof can be used in the optical print head. Further, the entire configuration of the optical print head can be modified based on that shown in FIGS. 9A and 9B.

<Operation of Print Head>

When the electric power, control signals and the like are supplied to the semiconductor device 100 via the connector 230, the driving circuits or the like of the Si thin film 90 drive the LEDs of the semiconductor thin films 10 to emit light. The emitted light proceeds in a direction shown by arrow D via the rod lens array 210, and forms an image.

For example, in the case where the optical print head of Embodiment 3 is used as an exposure unit of an electrophotographic printer (i.e., an image forming apparatus), a not shown photosensitive drum is disposed on a side indicated by arrow D in FIGS. 9A and 9B. The photosensitive drum is disposed by adjusting a distance between the optical print head and the photosensitive drum so that the light emitted by the optical print head is focused on the surface of the photosensitive drum.

<Effect>

The optical print head according to Embodiment 3 has the semiconductor device 100 according to Embodiment 1 or 2 (or any of their modifications), and therefore the optical print head can be compact in size, and can have a high light emission efficiency and reliability. The optical print head according to Embodiment 3 is applicable to various applications such as an exposure device used in an electrophotographic printer, an electrophotographic copier or the like.

While the preferred embodiments of the present invention have been illustrated in detail, it should be apparent that modifications and improvements may be made to the invention without departing from the spirit and scope of the invention as described in the following claims.

What is claimed is:

1. A semiconductor device comprising:
   a substrate;
   a diamond-like carbon film formed on said substrate;
   an inorganic thin film directly formed on said diamond-like carbon film and having a thickness thinner than that of said diamond-like carbon film;
   a semiconductor thin film having a semiconductor element and being directly bonded onto a first portion of said inorganic thin film; and
   a Si thin film having a circuit element connected to said semiconductor element, said Si thin film being directly bonded onto a second portion of said inorganic thin film,
   wherein said diamond-like carbon film, said inorganic thin film and said semiconductor thin film are laminated in that stated order on said substrate.

2. The semiconductor device according to claim 1, wherein a plurality of said semiconductor thin films are bonded onto said inorganic thin film.

3. The semiconductor device according to claim 1, wherein a plurality of said semiconductor thin films are arranged in an array or arranged two-dimensionally.

4. The semiconductor device according to claim 1, wherein said semiconductor thin film is obtained by forming said semiconductor thin film on a different substrate, then separating said semiconductor thin film from said different substrate, and then bonding said semiconductor thin film onto said inorganic thin film.

5. The semiconductor device according to claim 1, wherein said inorganic thin film is composed of at least one material selected from AlN, $Al_2O_3$, SiN and $SiO_2$.

6. The semiconductor device according to claim 1, wherein said semiconductor thin film is a compound semiconductor thin film.

7. The semiconductor device according to claim 6, wherein said semiconductor element is a light emitting element.

8. The semiconductor device according to claim 7, wherein said semiconductor element has two or three terminals.

9. The semiconductor device according to claim 1, wherein said substrate is a metal substrate, a ceramic substrate, a glass substrate or a plastic substrate.

10. The semiconductor device according to claim 9, wherein said metal substrate contains at least one material selected from copper, aluminum, brass, nickel, zinc and stainless steel.

11. An optical print head comprising:
    said semiconductor device according to claim 7, and
    an optical system that guides a light emitted by said light emitting element of said semiconductor device.

12. The semiconductor device according to claim 1, wherein said diamond-like carbon film has a thickness in a range from 5 nm to 100 nm.

13. The semiconductor device according to claim 1, further comprising a metal layer formed on a side of said diamond-like carbon film that includes said inorganic thin film or another side of said diamond-like carbon film that includes said substrate.

14. The semiconductor device according to claim 1, wherein said inorganic thin film includes a material with which a strong bonding force is produced between said inorganic thin film and said semiconductor thin film.

15. The semiconductor device according to claim 1, wherein said inorganic thin film has a heat expansion coefficient close to that of said semiconductor thin film.

16. The semiconductor device according to claim 1, wherein said inorganic thin film has a high heat conducting property.

17. The semiconductor device according to claim 1, wherein the circuit element is a driving circuit.

18. The semiconductor device according to claim 1, wherein
    said diamond-like carbon film, said inorganic thin film and said semiconductor thin film are laminated in that stated order on said substrate along a first direction, and
    the entire Si thin film is disposed relative to the entire semiconductor thin film along a second direction perpendicular to the first direction.

* * * * *